(12) United States Patent
Hsu (10) Patent No.: US 9,130,035 B2
(45) Date of Patent: Sep. 8, 2015

(54) TRENCH POWER MOSFET AND MANUFACTURING METHOD THEREOF (71) Applicant: SUPER GROUP SEMICONDUCTOR CO., LTD., New Taipei (TW)

(72) Inventor: Hsiu-Wen Hsu, Hsinchu County (TW)

(73) Assignee: SUPER GROUP SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 14/341,939

(22) Filed: Jul. 28, 2014

(65) Prior Publication Data

US 2015/0200294 A1     Jul. 16, 2015

(30) Foreign Application Priority Data

Jan. 10, 2014   (TW) .............................. 103100997 A (51) Int. Cl.
*H01L 29/78*     (2006.01)
*H01L 29/66*     (2006.01)
*H01L 29/423*    (2006.01)
*H01L 29/06*     (2006.01)
*H01L 29/10*     (2006.01)
*H01L 21/311*    (2006.01)
*H01L 21/762*    (2006.01)

(52) U.S. Cl.
CPC ...... *H01L 29/7813* (2013.01); *H01L 21/31111* (2013.01); *H01L 21/762* (2013.01); *H01L 29/0649* (2013.01); *H01L 29/1033* (2013.01); *H01L 29/1095* (2013.01); *H01L 29/4236* (2013.01); *H01L 29/66734* (2013.01)

(58) Field of Classification Search
CPC ...................................... H01L 29/781–29/7815
USPC ........................... 257/330–334; 438/269–272
See application file for complete search history.

(56) References Cited

U.S. PATENT DOCUMENTS 5,688,725 A * 11/1997 Darwish et al. ............... 438/270
7,737,491 B2 * 6/2010 Hotta et al. .................... 257/330

* cited by examiner

*Primary Examiner* — Daniel Shook
(74) *Attorney, Agent, or Firm* — Li&Cai Intellectual Property (USA) Office (57) ABSTRACT

A trench power MOSFET and a manufacturing method thereof are provided. The trench power MOSFET has a buried oxide layer formed in the epitaxial layer, wherein the buried oxide layer is located under a body region for changing a vertical electric field distribution to increase a breakdown voltage of the MOSFET, thereby obtaining a lower on-state resistance.

9 Claims, 8 Drawing Sheets

TRENCH POWER MOSFET AND MANUFACTURING METHOD THEREOF

BACKGROUND

1. Technical Field

The present disclosure relates to a power MOSFET in particular, to a trench power MOSFET having low on-state resistance and high breakdown voltage and a manufacturing method thereof.

2. Description of Related Art

Power Metal Oxide Semiconductor Field Effect Transistors (MOSFETs) are voltage-controlled devices. Power MOSFETs generally have vertical and horizontal structures, which are well known in the art. Power MOSEFTs have advantages of fast switching, good high frequency performance, high input impedance, and relatively low driving power. Power MOSFETs have been widely utilized in switching applications for power equipment such as power supplies, rectifiers, or low voltage motor controllers. Currently, most of power MOSFETs adopt vertical structure for increasing the component density.

The operation loss of power MOSFETs includes the switching loss and the conduction loss, wherein the on-state resistance (Rds) of the power MOSFETs in conduction is one of the important parameters in determining the operation loss of power MOSFETs. It is well known in the art, that the smaller the on-state resistance, the lower the conduction loss, therefore the lower the power consumption. The on-state resistance of a power MOSFETs is directly proportional to the thickness of the drift region, i.e., the on-state resistance can be reduced by reducing the thickness of the drift region. However, by reducing the thickness of the drifting region, also reduces the breakdown voltage which affects the voltage withstand capability of the power MOSFETs.

SUMMARY

The present disclosure provide a trench power MOSFET and the manufacturing method thereof, which utilize the reduce surface field (RESURF) principle and dispose an oxide layer under the body region to increase the breakdown voltage, so as to obtain lower on-state resistance for same breakdown voltage characteristic.

An exemplary embodiment of the present disclosure provides a trench power MOSFET, which includes a substrate, an epitaxial layer, an oxide layer, a channel region, a body region, a second heavily doped region and a trench gate structure. The substrate having a first heavily doped region formed therein. The epitaxial layer is formed above the substrate, wherein the epitaxial layer has a drift region formed therein. The oxide layer is formed above the drift region. The channel region is formed on one side of the oxide layer. The body region is formed above the oxide layer and the channel region, wherein the channel region connects the body region and the drift region. The second heavily doped region is formed above the body region. The trench gate structure is formed on the sides of the second heavily doped region and the body region. The channel region is formed between the trench gate structure and the oxide layer.

According to one exemplary embodiment of the present disclosure, the width of the channel region is less than the width of the oxide layer.

According to one exemplary embodiment of the present disclosure, the channel region and the drift region are N-type doped regions, the body region is a P-type doped region, and the first and the second heavily doped regions are N-type doped region.

According to one exemplary embodiment of the present disclosure, the oxide layer, the channel region, the body region, the second heavily doped region, and the trench gate structure are respectively formed in the epitaxial layer. The trench gate structure can extend into the drift region.

An exemplary embodiment of the present disclosure provides a manufacturing method of a trench power MOSFET, which includes the following steps. A substrate is provided. An epitaxial layer is formed above the substrate thereafter. A drift region and an oxide layer are respectively formed in the epitaxial layer, wherein the oxide layer is formed above the drift region. A trench gate structure and a channel region are respectively formed in the epitaxial layer, wherein the channel region is formed between the oxide layer and the trench gate structure. A body region is formed above the oxide layer and the channel region, wherein the channel region connects the body region and the drift region. A heavily doped region is formed above the body region.

According to one exemplary embodiment of the present disclosure, the step of forming the epitaxial layer further includes the following steps. A lower epitaxial layer is first formed on the substrate. A main oxide layer is subsequently formed on the lower epitaxial layer. The main oxide layer is etched into a plurality of segments thereafter, wherein one of the segments forms the oxide layer. Have the lower epitaxial layer increase thickness thereof in an upward direction to cover the oxide layer and form the epitaxial layer.

To sum up, exemplary embodiments of the present disclosure provide the trench power MOSFET and the manufacturing method thereof, which by forming a buried oxide layer in the epitaxial layer can change the vertical electric field distribution of the trench power MOSFET, thereby increase the breakdown voltage of the trench power MOSFET. Accordingly, the silicon limitation can be overcome and lower on-state resistance can be obtained at same time.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Directional terminology such as up, down, under, below, front, back, left, and right, will be used in the following description in reference to the figures drawn and are not intended to imply absolute orientation, therefore shall not be used to limit the present disclosure. Wherever possible, the same reference numbers are used in the drawings and the description to refer to the same or like parts.

Figure 1A:
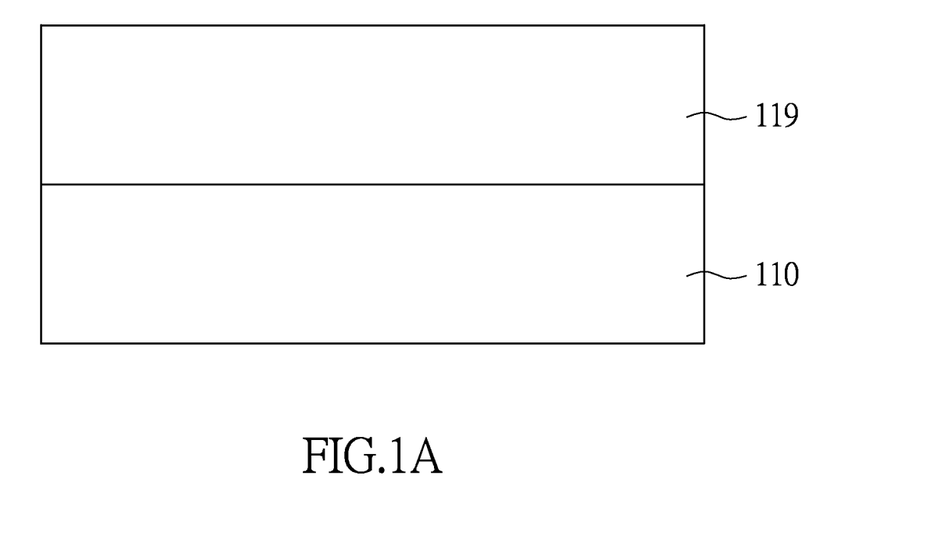
FIG. 1A~FIG. 1H are diagrams respectively illustrating a manufacturing method of a trench power MOSFET provided in accordance to an exemplary embodiment of the present disclosure.

FIG. 1A~FIG. 1H shows diagrams respectively illustrating a manufacturing method of a trench power MOSFET provided in accordance to an exemplary embodiment of the present disclosure. As shown in FIG. 1A, a substrate 110 is first provided and a lower epitaxial layer 119 is formed on the substrate 110 thereafter. The substrate 110, such as a silicon substrate, has a first heavily doped region with high doping concentration functioned as a drain of a trench power MOSFET. The lower epitaxial layer 119 has low doping concentration and can be configured to form a drift region of the trench power MOSFET.

For instance, a portion or the entire substrate 110 can be heavily doped region depend on the configuration of the drain region. For illustration, the first heavily dope region of the instant embodiment is the entire substrate 110, however, the present disclosure is not limited thereto. The dopant type of the lower epitaxial layer 119 and the dopant type of the substrate 110 are the same. Particularly, the doping concentration of the lower epitaxial layer 119 is lower than the doping concentration of the substrate 110. Taking an N-type power MOSFET as an example, the substrate 110 can be doped with high concentration N-type dopant (N+), while the lower epitaxial layer can be doped with low concentration N-type dopant (N−). Taking a P-type power MOSFET for example, the substrate 110 can be doped with high concentration P-type dopant (P+), while the lower epitaxial layer can be doped with low concentration P-type dopant (P−). In the trench power MOSFET structure, the drain of the trench power MOSFET is formed on the substrate 110, the source of the trench power MOSFET is formed on an upper surface of an epitaxial layer, and the gate of the trench power MOSFET can be formed in the trenches of the epitaxial layer, wherein the epitaxial layer can be implemented by having the lower epitaxial layer 119 increasing thickness in an upward direction.

Figure 1B:
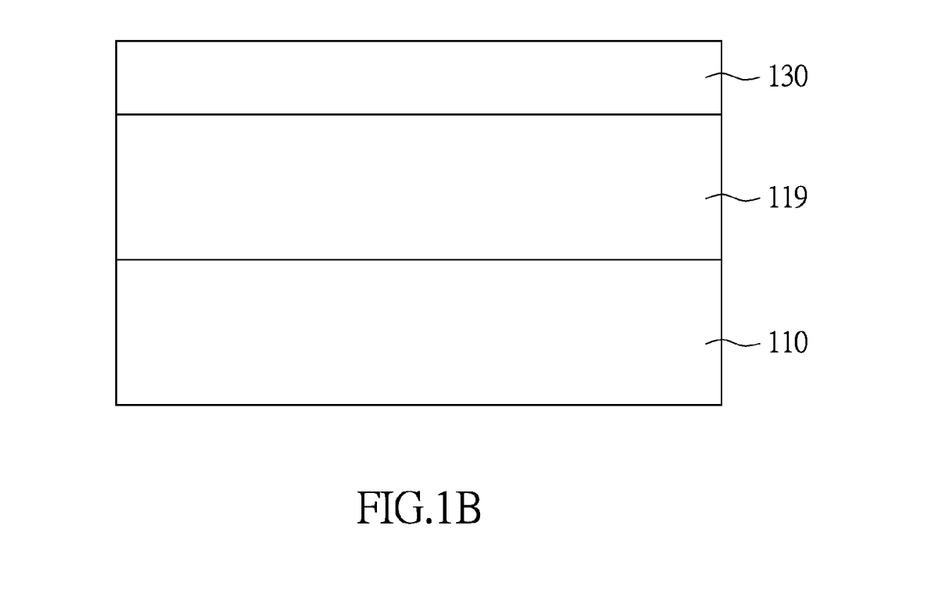
Figure 1C:
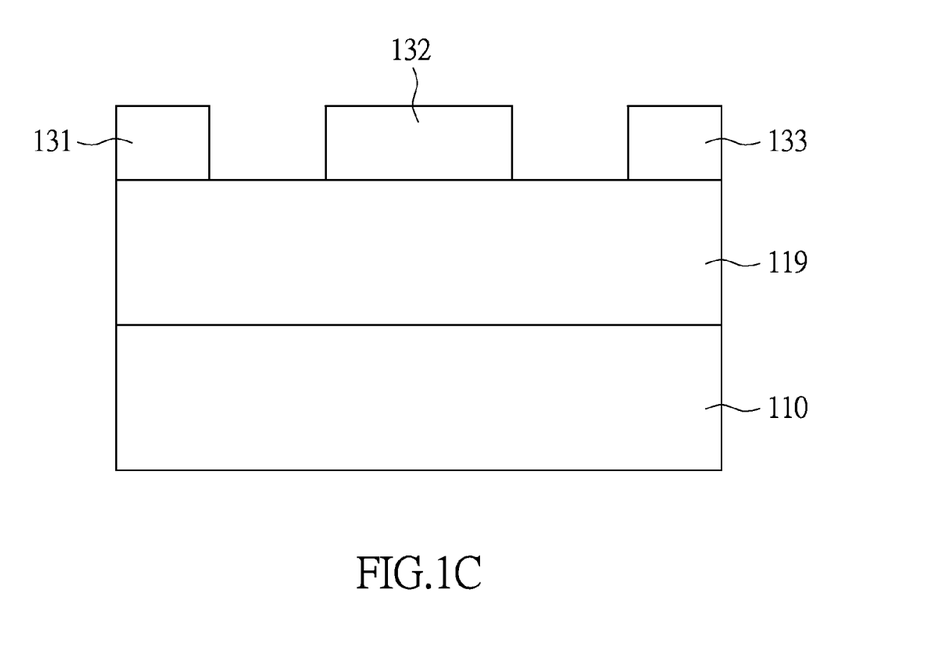
Figure 1D:
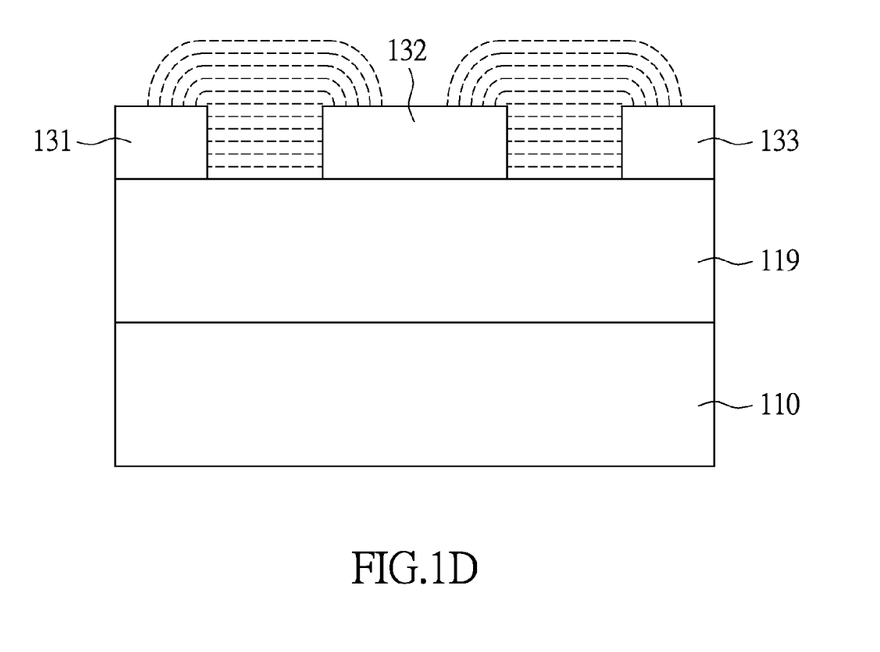
Figure 1E:
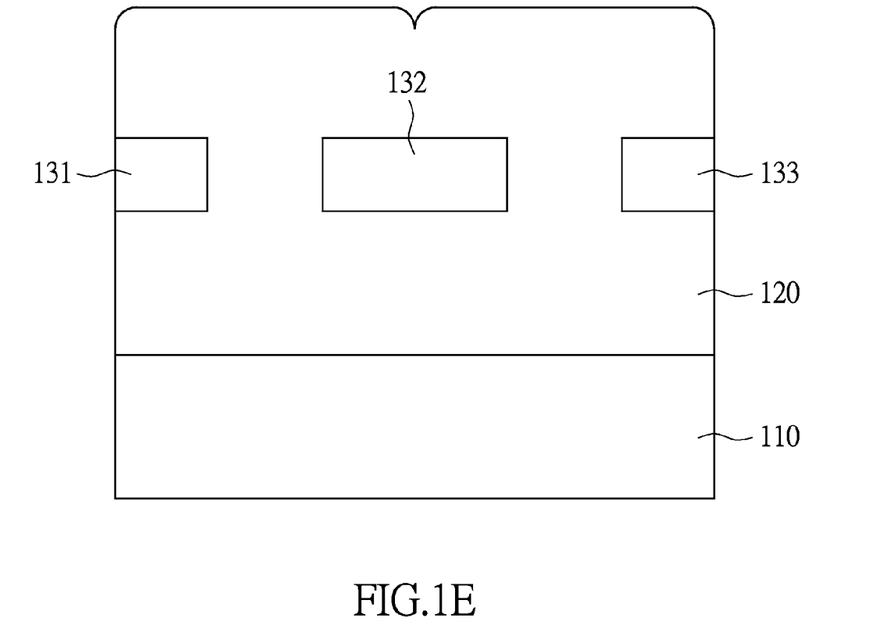
Figure 1F:
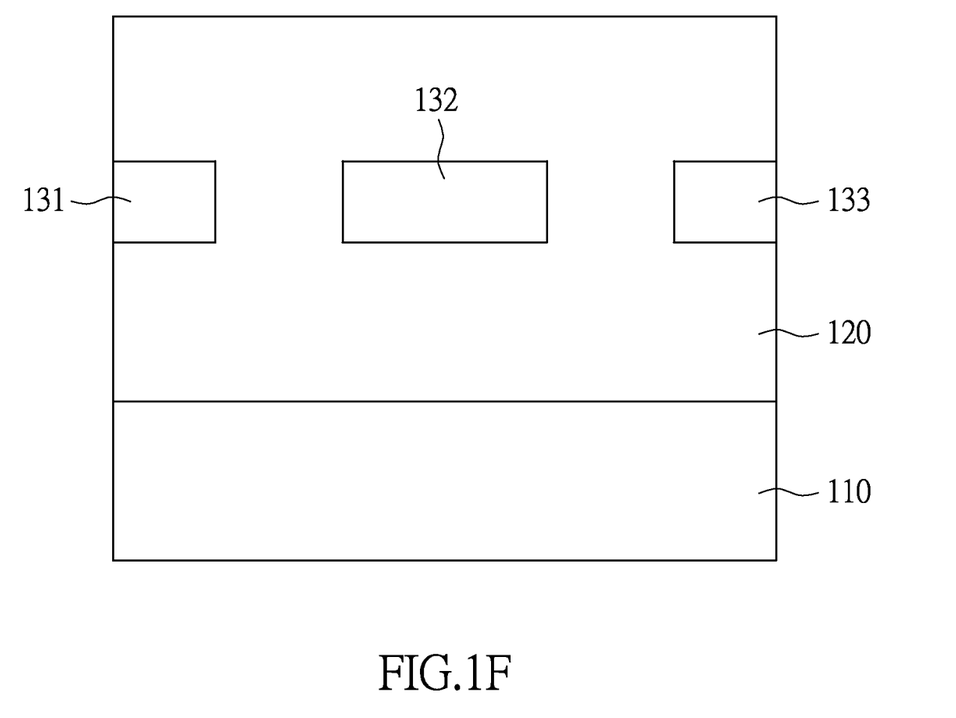

Please refer to FIG. 1B and FIG. 1C. A main oxide layer 130 is formed above the lower epitaxial layer 119 using oxidation method. The main oxide layer 130 is etched thereafter into a plurality of segments for forming a plurality of separated oxide layers 131, 132, and 133. FIG. 1C uses three segments as an illustration example, and the oxide layer 132 can be formed from one of the segments. In the instant embodiment, the main oxide layer 130 can be etched into a plurality of segments for simultaneously forming the oxide layers at different locations. Each of the oxide layers 131, 132, and 133 can be silicon dioxide (SiO2). Then, as shown in FIG. 1D, the lower epitaxial layer 119 can continue to grow thickness in an upward direction to cover the oxide layers 131, 132, and 133 to form the epitaxial layer 120 shown in FIG. 1E via selective epitaxial growth process. The oxide layers 131, 132, 133 are covered by the epitaxial layer 120 formed to form the buried oxide layers. Next, as shown in FIG. 1E, the epitaxial layer 120 is process with surface planarization thereafter. The step of surface planarization can be implemented by the chemical mechanical polishing/planarization (CMP) method as shown in FIG. 1F, and the instant embodiment is not limited thereto.

In the instant embodiment, the epitaxial layer formed in two manufacturing processing steps can be views as a single epitaxial layer 120 serves the epitaxial layer of the trench power MOSFET. The main reason of growing the thickness of the lower epitaxial layer 119 using selective epitaxial growth is to bury the oxide layers 131, 132, and 133. In another embodiment, the lower epitaxial layer 119 can be grown to the desire thickness to form the epitaxial layer, and etches the epitaxial layer to generate a plurality of recesses thereafter. Next, oxide layers 131, 132, 13 are respectively formed at the bottom of the recesses. The selective epitaxial growth process is then applied to oxide layers 131, 132 and 133 to cover the oxide layers 131, 132, and 133. Therefore, the instant embodiment does not limit the exact implementation of forming the buried oxide layers 131, 132 and 133 and the method for forming the epitaxial layer, so long as buried oxide layers 131, 132 and 133 can be formed.

It can be noted, the processing steps depicted in FIG. 1B~FIG. 1F are mainly implemented to form and to have the oxide layers 131, 132 and 133 formed above the drift region. The upper portion of the epitaxial layer 120 can be utilized to form other parts of the trench power MOSFET, such as gate structure, source structure, and the body region.

Figure 1G:
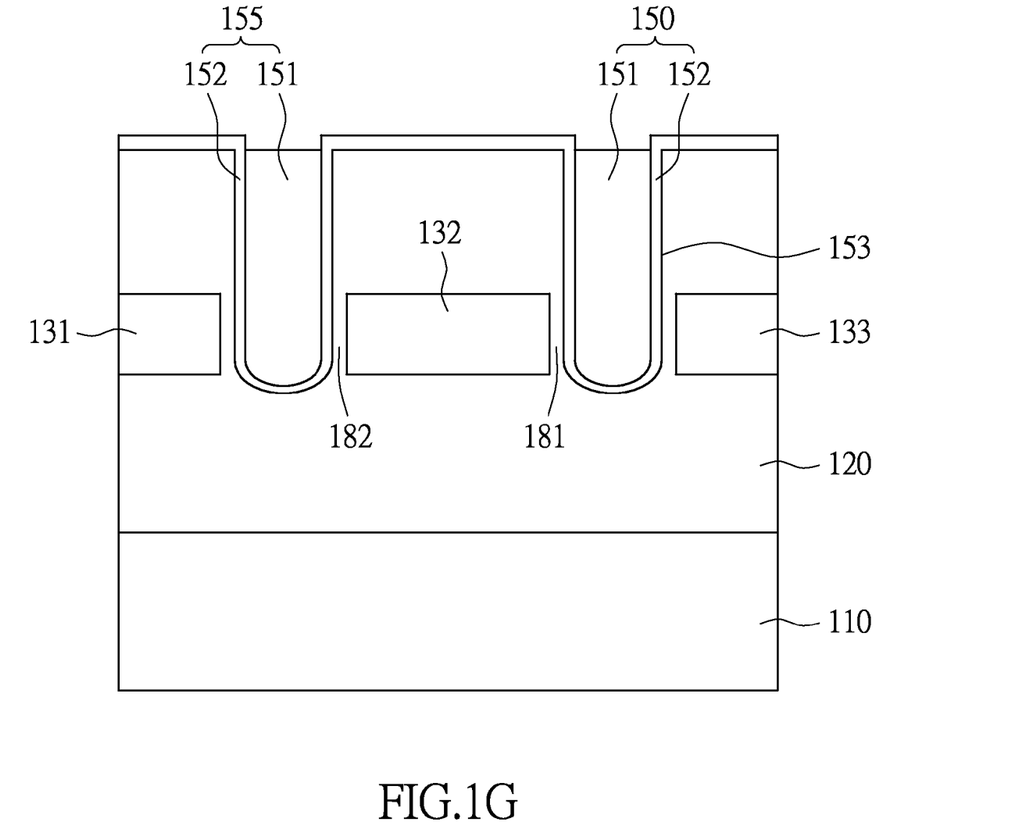

Please refer to FIG. 1G, a plurality of trenches 153 is next formed in the epitaxial layer 120 and trench gate structures 150 and 155 are respectively formed in the trenches 153 thereafter. The trench gate structure 150 comprises of isolation layer 152 and the conductive gate electrode 151, wherein the isolation layer 152 is formed on an inner wall of the trench 153 and is used for isolating the conductive gate electrode 151 and the epitaxial layer 120. The isolation layer 152 can comprise of silicon dioxide. The conductive gate electrode can be a poly-silicon gate or a conductive metal.

The trench gate power MOSFET has a plurality of trench gate structures 150, 155, wherein the oxide layer 132 is located between the trench gate structures 150 and 155. The space between the oxide layer 132 and the trench gate structure 150 forms a first channel region 181. The space between the oxide layer 132 and the trench gate structure 155 forms a second channel region 182. The first and the second channel regions 181 and 182 are formed on both side of the oxide layer 132 and are used as the current channel between the source and the drain. The material of the first and the second channel regions 181 and 182 are the same as the epitaxial layer 120.

Figure 1H:
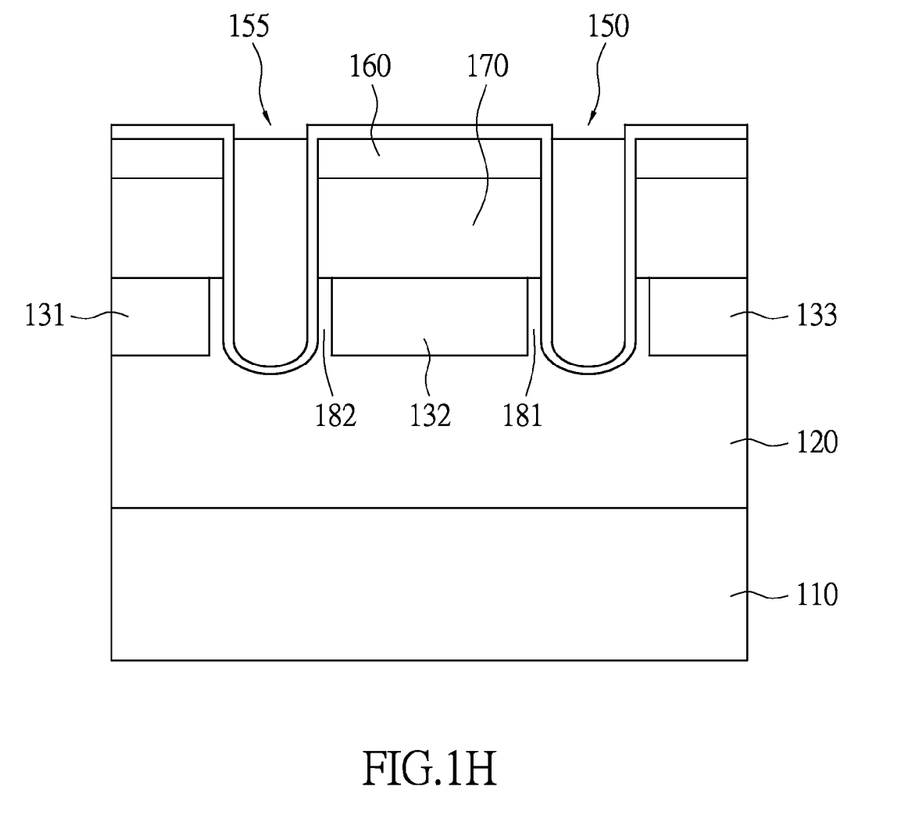

Please refer to FIG. 1H, utilize a doping process to form a body region 170 and a second heavily doped region 160 above the oxide layer 132. The body region 170 is formed between the oxide layer 132 and the second heavily doped region 160. The second heavily doped region can be configured to function as the source of the trench power MOSFET, while the body region 170 can be the base of the trench power MOSFET. The difference between the body region 170 and the second heavily dope region 160 is in the dopant type and the doping concentration. Taking an NMOS transistor as an example, the second heavily doped region 160 can be N-type doped while the body region can be P-type doped, such as P-well. The doping concentration of the body region 170 is lower than the doping concentration of the second heavily doped region 160.

The oxide layer 132 is a buried structure and is immediately adjacent to the bottom of the body region 170. More specifically, the oxide layer 132 is formed at the junction between the body region 170 and the epitaxial layer 120 for reducing the vertical electric field strength at the PN junction and increasing the breakdown voltage of the trench power MOSFET. The oxide layer 132 can form a RESURF structure below the body region 170 for increasing the breakdown voltage of the trench power MOSFET. Similarly, each of the oxide layers 131, and 133 is formed under the respective body region, for changing the electric field distribution and forming a RESURF structure that operatively reduces the vertical electric field strength. Moreover, the drain-source breakdown voltage (BVdss) can be increased using the RESURF principle. The formation of the RESURF structure can enable the trench power MOSFET to obtain higher drain-source breakdown voltage and relatively lower drain-source on-state resistance (Rdson) for same breakdown voltage characteristic.

Vertical-type power transistor can increase the breakdown voltage thereof either by increasing the thickness of the drift region or lowering the doping concentration of the body region 170. However, increasing the thickness of the drift or reducing the doping connection also increases the on-state resistance and generates conduction loss. As described in the instant embodiment, by depositing the oxide layers 131, 132, and 133, the trench power MOSFET can obtain higher drain-source breakdown voltage for the same epitaxial layer thickness and same doping concentration, thereby overcome the silicon limitation. That is to say, under the same breakdown voltage requirement, the trench power MOSFET of the instant embodiment can obtain even lower on-state resistance.

From the aforementioned exemplary embodiments, the present disclosure can further generalize a manufacturing method of a trench power MOSFET. Please refer to FIG. 2, which shows a flowchart illustrating a manufacturing method of a trench power MOSFET provided in accordance to an exemplary embodiment of the present disclosure. The manufacturing method includes the following steps. Firstly, a substrate is provided (Step S210). An epitaxial layer is formed on the substrate, and a drift region and the oxide layer is formed in the epitaxial layer thereafter, wherein the oxide layer is formed above the drift region. (Step S220) Next, a trench gate structure and a channel region are formed in the epitaxial layer, wherein the channel region is formed between the oxide layer and the trench gate structure. (Step S230). A body region is next formed above the oxide layer and the channel region, wherein the channel region connects the body region and the drift region. (Step S240) A heavily doped region is subsequently formed above the body region. (Step S250)

Figure 2:
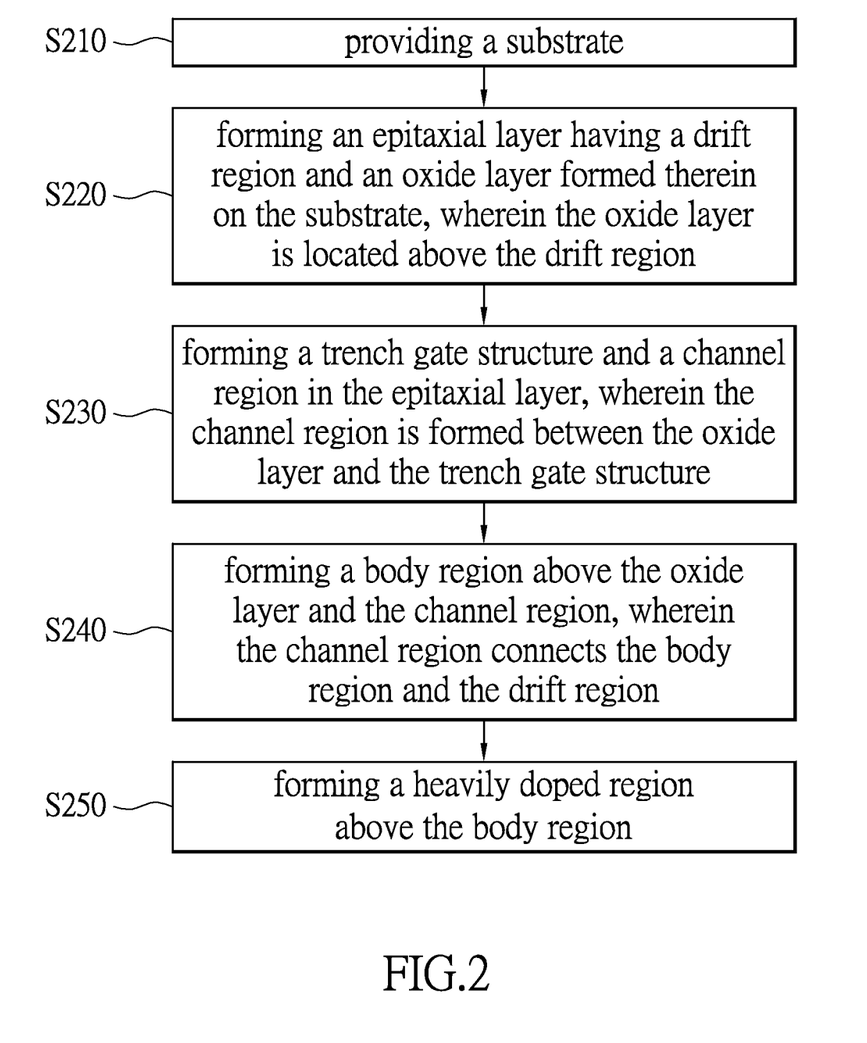
FIG. 2 is a flowchart illustrating the manufacturing method of the trench power MOSFET provided in accordance to an exemplary embodiment of the present disclosure.

In one embodiment of the present disclosure, the step of forming the epitaxial layer depicted in Step S220 further includes the following steps. A lower epitaxial layer is first formed on the substrate provided. A main oxide layer is next formed above the lower epitaxial layer. Afterward, the main oxide layer is etched into a plurality of segments, wherein one of the segment forms the oxide layer. Then, have the lower epitaxial layer increasing thickness in an upward direction to cover the oxide layer to form the epitaxial layer. The above describe method is one of the methods for implementing the buried oxide layer and the present disclosure is not limited thereto.

It is worth to note that, a trench gate MOSFET can include multiple oxide layers, respectively formed between the respective body region and the drift region. The oxide layers can be simultaneously formed using Step S220 as described previously, or separately formed at different locations by repeating Step S220 multiple times. The trench gate structures and the corresponding channel regions can be simultaneously formed in Step S230. Each individual channel region is formed between the respective trench gate structure and the oxide layer for functioning as a current path. The channel regions can be used to lower the on-state resistance of the trench power MOSFET.

The order of Steps S210~S250 may be altered according to the manufacturing processing requirements, for instance, Step S230 and Step S240 may be interchanged. It is understood that the instant embodiment does not limit to the exact order of Steps S210~S250 suggested. The implementation details associated with Step S210~S250 have been detailed described aforementioned embodiments as well as FIG. 1A~FIG. 1H, hence further descriptions are hereby omitted.

Figure 3:
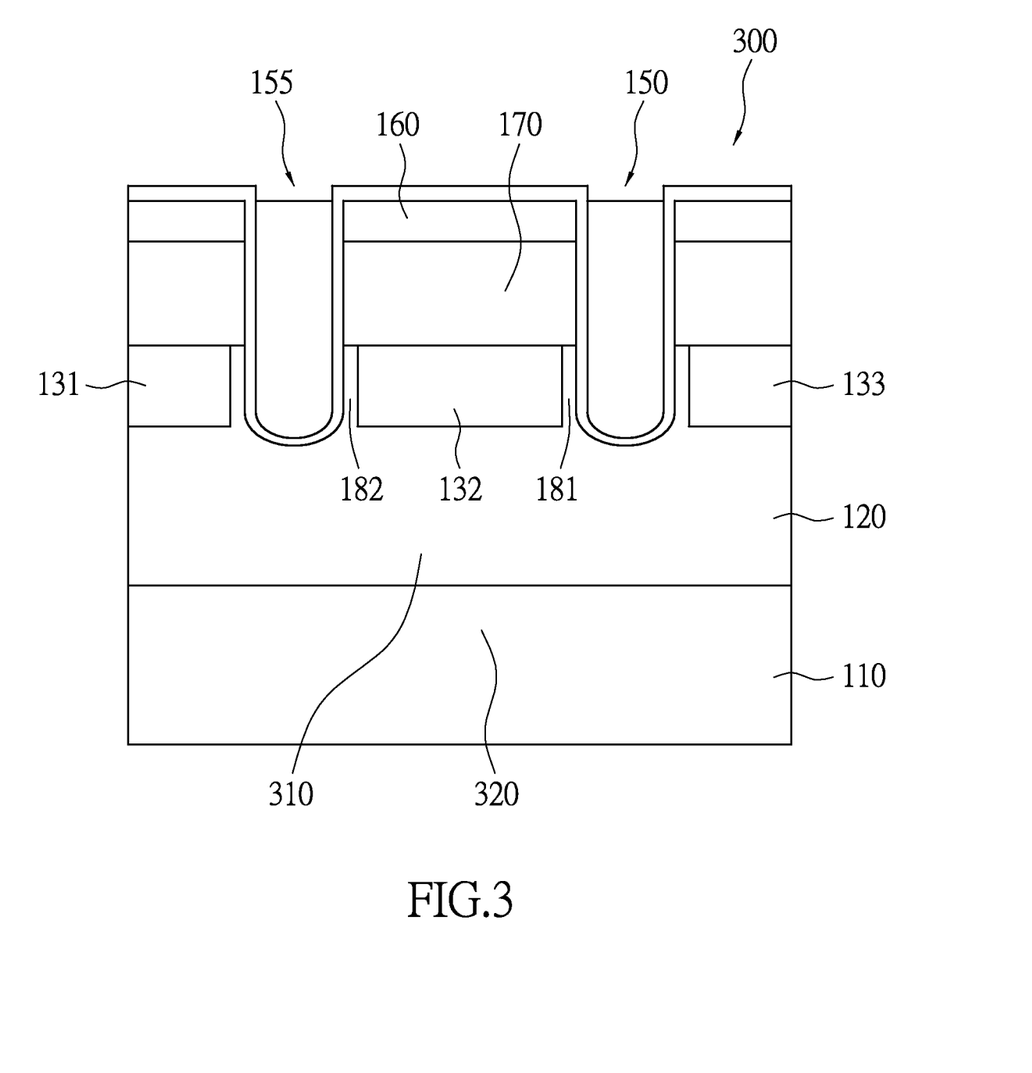
FIG. 3 is a diagram illustrating a portion of the trench power MOSFET provided in accordance to an exemplary embodiment of the present disclosure.

Please refer to FIG. 3, which shows a diagram illustrating a portion of the trench power MOSFET provided in accordance to an exemplary embodiment of the present disclosure. A substrate 110 has a first heavily doped region 320 functioning as a drain of a trench power MOSFET 300. The first heavily doped region 320 can be a portion or the entire substrate 110. In the instant embodiment, the entire substrate 110 is the first heavily doped region 320. An epitaxial layer 120 has a second heavily doped region 160, a body region, an oxide layer 132, a first channel region 181, a second channel region 182, and a drift region 310 formed therein. The second heavily doped region 160 functions as a source of the trench power MOSFET 300. The body region 170 is formed between the second heavily doped region 160 and the oxide layer 132. The first channel region 181, the second channel region, and the oxide layer 132 are located between the body region 170 and the drift region 310 and are used for isolating the body region 170 and the drift region 310. The first channel region 181 and the second channel region 182 are formed on the two side of the oxide layer 132. The first channel region 181 and the second channel region 182 respectively connect the body region 170 and the drift region 310. The first channel region 181 and the second channel region 182 are used to provide two current paths for reducing the on-state resistance. That is, the body region 170 connects the drift region 310 through the first channel region 181 and the second channel region 182, and conducts current through the first channel region 181 and the second channel region 182. It is known that the widths of the first channel region 181 and the second channel region 182 affect the conduction impedance, and can be configured according to the needs, e.g., smaller than the width of the oxide layer 132.

Taking an N-type power transistor as an example, the substrate 110 is doped with high concentration N-type dopant (i.e., heavily doped region N+) forming the first heavily doped region. The first channel region 181 and the second channel region 182 are lightly doped N-type regions (i.e., lightly doped region N−). The epitaxial layer 120 formed below the oxide layer 132 is doped with low concentration N-type dopant to form the drift region 310. The drift region 310 also may be formed by forming a portion of doping region under the oxide layer 132 using the ion implantation method. In the instant embodiment, the epitaxial layer 120 formed below the oxide layer 132 is doped with low concentration N-type dopant to form the drift region 310. The body region 170 is lightly doped P-type region, while the second heavily doping region 160 is a highly doped N-type region forming the source of the trench power MOSFET 300. The trench gate structures 150, 155 are respectively located in the trenches of the epitaxial layer 120 and can each extend into the drift region 310 depending upon the design requirement. The trench gate structures 150, 155 are deposited on the two sides of the oxide layer 132. The first channel region 181 and the second channel region 182 are respectively formed between the trench gate structures 150, 155 and the oxide layer 132.

In general, the ratio between the dopant and the semiconductor atoms of a semiconductor with high doping concentration is approximately a thousand to one. The ratio between the dopant and the semiconductor atoms of a semiconductor with low doping concentration may be a billion to one. The exact ratio may be configured according different component requirements and the instant embodiment is not limited thereto. The doping method used herein may be the ion implantation and diffusion.

A complete trench power MOSFET can comprise of a plurality of the structure unit depicted in FIG. 3 for increase the width of the channel region and conducting current. FIG. 3 is merely used to illustrate a portion of the trench power MOSFET. Based on the above elaborations, those skilled in the art should be able to understand and infer the implementation details associated with the rest of the trench power MOSFET structure, and further descriptions are therefore omitted.

In summary, an exemplary embodiment of the present disclosure provide the trench power MOSFET, which utilizes the RESURF principle and forms a buried oxide layer under the body region reducing the vertical electric field strength. The RESURF structure can increase the breakdown voltage of the trench power MOSFET, therefore overcomes the silicon limitation and obtains lower on-state resistance characteristic for the same structure.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A trench power MOSFET, comprising:
    a substrate having a first heavily doped region;
    an epitaxial layer formed above the substrate, wherein the epitaxial layer has a drift region;
    an oxide layer formed above the drift region;
    a channel region formed on one side of the oxide layer;
    a body region formed above the oxide layer and the channel region, wherein the channel region connects the body region and the drift region;
    a second heavily doped region formed above the body region; and
    a trench gate structure formed on the side of the second heavily dope region and the body region;
    wherein the channel region is formed between the trench gate structure and the oxide layer.

2. The trench power MOSFET according to claim 1, wherein the width of the channel region is less than the width of the oxide layer.

3. The trench power MOSFET according to claim 1, wherein the channel region and the drift region are N-type doped regions, the body region is a P-type doped region, and the first heavily doped region and the second heavily doped region are N-type doped regions.

4. The trench power MOSFET according to claim 1, wherein the trench gate structure extends into the drift region.

5. The trench power MOSFET according to claim 1, wherein the oxide layer, the channel region, the body region, the second heavily doped region, and the trench gate structure are respectively formed in the epitaxial layer.

6. The trench power MOSFET according to claim 1, wherein the gate trench structure is formed in a trench of the epitaxial layer, and the gate trench structure comprises:
    an isolation layer formed on an inner wall of the trench; and
    a conductive gate electrode formed in the trench, and the isolation layer being between the conductive gate electrode and the epitaxial layer.

7. A manufacturing method of a trench power MOSEFET, comprising:
    providing a substrate;
    forming an epitaxial layer having a drift region and an oxide region formed therein above the substrate, wherein the oxide layer is formed above the drift region;
    forming a trench gate structure and a channel region in the epitaxial layer, wherein the channel region is formed between the oxide layer and the trench gate structure;
    forming a body region above the oxide layer and the channel region, wherein the channel region connects the body region and the drift region; and
    forming a heavily doped region above the body region.

8. The manufacturing method of the trench power MOSEFET according to claim 7, wherein the channel region and the drift region are N-type doped regions, the body region is a P-type doped region, and the heavily doped region are N-type doped region.

9. The manufacturing method of the trench power MOSEFET according to claim 7, wherein the step of forming the epitaxial layer comprises:
    forming a lower epitaxial layer on the substrate;
    forming a main oxide layer above the lower epitaxial layer;
    etching the main oxide layer into a plurality of segments, wherein the oxide layer is formed from one of the segments; and
    having the lower epitaxial layer to increase thickness in an upward direction to cover the oxide layer and to form the epitaxial layer.

* * * * *